US012756161B2

(12) United States Patent
Bai

(10) Patent No.: US 12,756,161 B2
(45) Date of Patent: Oct. 6, 2026

(54) SLOW AXIS, OR SLOW AXIS AND FAST AXIS, WAVELENGTH BEAM COMBINING FOR LASER MINIBARS

(71) Applicant: Lumentum Operations LLC, San Jose, CA (US)

(72) Inventor: John G. Bai, San Jose, CA (US)

(73) Assignee: Lumentum Operations LLC, San Jose, CA (US)

( * ) Notice: Subject to any disclaimer, the term of this patent is extended or adjusted under 35 U.S.C. 154(b) by 644 days.

(21) Appl. No.: 18/335,811

(22) Filed: Jun. 15, 2023

(65) Prior Publication Data

US 2023/0411934 A1 Dec. 21, 2023

Related U.S. Application Data

(60) Provisional application No. 63/366,573, filed on Jun. 17, 2022.

(51) Int. Cl.
*H01S 5/40* (2006.01)
*H01S 5/00* (2006.01)
(Continued)

(52) U.S. Cl.
CPC ............ *H01S 5/4012* (2013.01); *H01S 5/005* (2013.01); *H01S 5/02253* (2021.01); (Continued)

(58) Field of Classification Search
CPC .... H01S 5/4012; H01S 5/005; H01S 5/02253; H01S 5/02315; H01S 5/141; H01S 5/2036; H01S 5/4087
See application file for complete search history.

(56) References Cited

U.S. PATENT DOCUMENTS 8,427,749 B2 4/2013 Du et al.
8,437,086 B2 5/2013 Du et al.
(Continued)

FOREIGN PATENT DOCUMENTS

WO 2012058683 A2 5/2012

OTHER PUBLICATIONS

R. K. Huang, et al.; "High-Brightness Wavelength Beam Combined Semiconductor Laser Diode Arrays"; IEEE Photonics Technology Letters; Feb. 15, 2007; pp. 209-211; vol. 19, No. 4; doi: 10.1109/LPT.2006.890717.

(Continued)

*Primary Examiner* — Yuanda Zhang
(74) *Attorney, Agent, or Firm* — Harrity & Harrity, LLP

(57) ABSTRACT

An optical module includes a stepped structure; a plurality of laser minibars; a plurality of FACs; a plurality of SACs; a plurality of gratings; and an OC. At least one laser minibar, of the plurality of laser minibars, is disposed on each step of the plurality of steps of the stepped structure. The plurality of laser minibars are configured to emit a plurality of laser beams. The plurality of gratings are configured to receive the plurality of laser beams via the plurality of FACs and the plurality of SACs, to combine the plurality of laser beams into a plurality of single laser beams, and to direct the plurality of single laser beams to the OC. The OC is configured to receive the plurality of single laser beams from the plurality of gratings, and to direct a portion of the plurality of single laser beams out of the optical module.

20 Claims, 4 Drawing Sheets

(51) Int. Cl.

| | |
|---|---|
| ***H01S 5/02253*** | (2021.01) |
| ***H01S 5/02315*** | (2021.01) |
| ***H01S 5/14*** | (2006.01) |
| ***H01S 5/20*** | (2006.01) |

(52) U.S. Cl.

CPC .......... *H01S 5/02315* (2021.01); *H01S 5/141* (2013.01); *H01S 5/2036* (2013.01); *H01S 5/4087* (2013.01)

(56) References Cited

U.S. PATENT DOCUMENTS

| | | | | |
|---|---|---|---|---|
| 8,724,222 | B2 | 5/2014 | Chann et al. | |
| 2006/0280209 | A1 | 12/2006 | Treusch et al. | |
| 2009/0245315 | A1* | 10/2009 | Faybishenko | G02B 6/4214 372/50.12 |
| 2009/0323752 | A1* | 12/2009 | Chuyanov | G02B 19/0052 372/50.23 |
| 2010/0110556 | A1 | 5/2010 | Chann et al. | |
| 2012/0002395 | A1* | 1/2012 | Du | H01S 5/4012 362/241 |
| 2022/0271501 | A1* | 8/2022 | Yu | H01S 5/4012 |
| 2022/0344910 | A1* | 10/2022 | Muendel | H01S 5/12 |

OTHER PUBLICATIONS

M. Haas, et al.; "Beam Quality Deterioration in Dense Wavelength Beam-Combined Broad-Area Diode Lasers"; IEEE Journal of Quantum Electronics; Jun. 2017; pp. 1-11; vol. 53, No. 3; Art No. 2600111; doi: 10.1109/JQE.2017.2686358.

Antonio Sanchez-Rubio, et al.; "Wavelength Beam Combining for Power and Brightness Scaling of Laser Systems"; Lincoln Laboratory Journal; 2014, pp. 52-66, vol. 20, No. 2.

Jurgen Muller, et al.; "Towards 300 W high power laser bars"; Proc. SPIE 10900; High-Power Diode Laser Technology XVII, 109000C; Mar. 4, 2019; Event: SPIE LASE; doi: 10.1117/12.2509604; San Francisco, California, United States.

* cited by examiner

SLOW AXIS, OR SLOW AXIS AND FAST AXIS, WAVELENGTH BEAM COMBINING FOR LASER MINIBARS

CROSS-REFERENCE TO RELATED APPLICATION

This patent application claims priority to U.S. Patent Application No. 63/366,573, filed on Jun. 17, 2022, and entitled "OPTICAL MODULES WITH 1D SLOW AXIS OR QUASI 2D WAVELENGTH BEAM COMBINING FOR ENHANCED POWER AND BRIGHTNESS." The disclosure of the prior application is considered part of and is incorporated by reference into this patent application.

TECHNICAL FIELD

The present disclosure relates generally to an optical module and to slow axis, or slow axis and fast axis, wavelength beam combining for laser minibars.

BACKGROUND

Wavelength beam combining (WBC) is a technique that combines multiple laser beams (e.g., of different wavelengths) into a single laser beam.

SUMMARY

In some implementations, an optical module includes a stepped structure that includes a plurality of steps; a plurality of laser minibars; a plurality of fast axis collimators (FACs); a plurality of slow axis collimators (SACs); a plurality of gratings; and an output coupler (OC), wherein: each step, of the plurality of steps of the stepped structure, is associated with a particular distance, in a lateral direction from the OC, that is different than respective distances of other steps of the plurality of steps; each laser minibar, of the plurality of laser minibars, is disposed on a particular step, of the plurality of steps, that is different than the other steps of the stepped structure on which other laser minibars are disposed; each FAC, of the plurality of FACs, corresponds to a laser minibar, of the plurality of laser minibars, and is disposed between the laser minibar and a SAC, of the plurality of SACs, that corresponds to the laser minibar; each SAC, of the plurality of SACs, corresponds to a laser minibar, of the plurality of laser minibars, and is disposed between a FAC, of the plurality of FACs, that corresponds to the laser minibar and a grating, of the plurality of gratings, that corresponds to the laser minibar; and each grating, of the plurality of gratings, corresponds to a laser minibar, of the plurality of laser minibars, and is disposed between a SAC, of the plurality of SACs, that corresponds to the laser minibar and the OC.

In some implementations, an optical module includes a stepped structure that includes a plurality of steps; a plurality of laser minibars; a plurality of FACs; a plurality of SACs; a plurality of gratings; and an OC, wherein: at least one laser minibar, of the plurality of laser minibars, is disposed on each step of the plurality of steps of the stepped structure; the plurality of laser minibars are configured to emit a plurality of laser beams; the plurality of gratings are configured to receive the plurality of laser beams via the plurality of FACs and the plurality of SACs, to combine the plurality of laser beams into a plurality of single laser beams, and to direct the plurality of single laser beams to the OC; and the OC is configured to receive the plurality of single laser beams from the plurality of gratings, and to direct a portion of the plurality of single laser beams out of the optical module.

In some implementations, an optical module includes a stepped structure that includes a plurality of steps; a plurality of laser minibars; a plurality of SACs; and a plurality of gratings, wherein: a particular laser minibar, of the plurality of laser minibars, is disposed on a particular step, of the plurality of steps, that is different than other steps of the stepped structure on which other laser minibars are disposed; a particular SAC, of the plurality of SACs, corresponds to the particular laser minibar; a particular grating, of the plurality of gratings, corresponds to the particular laser minibar; the particular SAC is positioned between the particular laser minibar and the particular grating; the particular SAC is a first distance from the particular laser minibar that is equal to a focal length of the particular SAC; and the particular SAC is positioned at a second distance from the particular grating that is equal to the focal length.

DETAILED DESCRIPTION

Figure 1A:
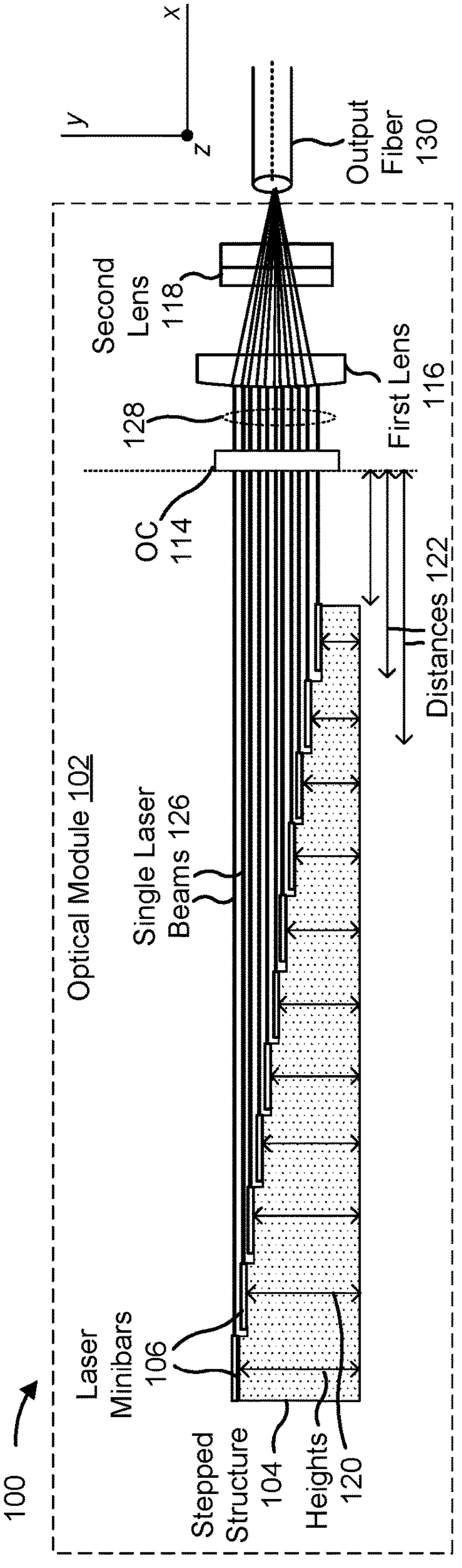
FIGS. 1A-1B are diagrams of an example implementation described herein.

The following detailed description of example implementations refers to the accompanying drawings. The same reference numbers in different drawings may identify the same or similar elements.

To provide a high-power laser beam (e.g., with kilowatt (kW)-class power), an optical module may utilize WBC. Such an optical module can include a "laser bar" of multiple broad area laser diodes (BALs). Typically, the multiple BALs are arranged in a linear array within the laser bar, wherein each BAL is a same distance away from a transform lens (e.g., a Fourier transform lens). Each BAL may emit a laser beam that is collimated by a fast axis collimation lens (FAC) and/or a slow axis collimation lens (SAC) and then is directed to a grating by the transform lens. The grating combines the individual laser beams emitted by the BALs into a combined laser beam (e.g., that has a power that is a combination of the powers of the individual laser beams) that is coupled into a fiber (e.g., of a fiber coupled optical module).

In some cases, n BALs (e.g., where n≥2) are stacked in the laser bar (e.g., stacked in a direction that is parallel to a fast axis of the laser beams emitted by the n BALs). For example, n BALs may be stacked to roughly equalize two orthogonal beam parameter products (BPPs) for a round core of the fiber (e.g., into which the combined laser beam couples). Accordingly, by stacking the n BALs with a fill factor $\gamma_{FA}$, the n BALs may have a total fast axis $BPP_{nFA}$ that is described using the following equation:

$$BPP_{nFA} = \frac{n}{\gamma_{FA}} BPP_{FA},$$

where $BPP_{FA}$ is the fast axis BPP of an individual BAL. Consequently, to ensure efficient fiber coupling, a maximum number of the n BALs is limited by the following relation:

$$\sqrt{(BPP_{SA})^2 + \left(\frac{n}{Y_{FA}}BPP_{FA}\right)^2} \leq BPP_C,$$

where $BPP_{SA}$ is the slow axis BPP of an individual BAL and $BPP_C$ is the BPP of the fiber.

Some implementations described herein provide an optical module that uses distributed laser minibars that are spaced apart at different horizontal and vertical distances from an optical coupler (OC) and/or a transform lens (e.g., a fast axis transform lens (FATL) or another type of transform lens). Each laser minibar may have a width of up to a few millimeters. Each laser minibar includes a plurality of laser emitters spaced along that width and each emits a laser beam with high beam quality (e.g., a laser beam that approaches its diffraction limitation), such as in a fast axis and a slow axis (e.g., in a vertical direction and in a lateral direction).

Each laser minibar is disposed on a step of the stepped structure and emits a plurality of laser beams (e.g., one laser beam from each respective laser emitter) within a particular wavelength range (e.g., each laser beam is centered at a particular wavelength within the particular wavelength range, such as after being wavelength locked, as described herein). The laser emitters of each laser minibar may be formed in a single row and may emit parallel to one another. Accordingly, each laser minibar emits a plurality of laser beams that propagate toward the OC. A plurality of FACs each collimate a respective plurality of laser beams in a first direction (e.g., in a fast axis of the plurality of laser beams) and a plurality of SACs each collimate the respective plurality of laser beams in a second direction (e.g., in a slow axis of the plurality of laser beams). Each of a plurality of gratings (with the grating lines put perpendicular to the slow axis direction) then combine (e.g., using WBC) the respective plurality of laser beams into one of a plurality of single laser beams (e.g., where a single laser beam is a combination of the respective plurality of laser beams emitted by a single laser minibar). In this way, some implementations facilitate slow axis WBC for laser minibars.

Further, the plurality of gratings are physically arranged (e.g. vertically relative to one another) so that the plurality of single laser beams (e.g., one single laser beam from each grating) are spatially coordinated (e.g., the plurality of single laser beams form a non-overlapping stack when viewed on the optical axis). For example, the plurality of gratings spatially combine the plurality of single laser beams (e.g., in a non-overlapped stack) when directing the plurality of single laser beams to the OC. In this way, the plurality of gratings provide spatial beam combination (SBC) of the plurality of single laser beams (e.g., concurrent to, and independent of, providing WBC of the plurality of laser beams into the plurality of single laser beams).

Each SAC is positioned at a particular distance from a corresponding laser minibar, such as a focal length of the SAC, and each grating is positioned at the same particular distance from a corresponding SAC. This allows the grating to convert respective angular and wavelength characteristics of a plurality of laser beams (e.g., in a slow axis of the plurality of laser beams) that are emitted by the laser minibar into combined wavelength characteristics of a single laser beam (e.g., in a slow axis of the single laser beam). For example, by positioning the grating the particular distance from the SAC, and by positioning the SAC the particular distance from the laser minibar, the grating is able to receive and overlap respective near field (NF) characteristics and/or respective far field (FF) characteristics of the plurality of laser beams (e.g., in a slow axis) to form the single laser beam. Accordingly, this allows the single laser beam to have an improved BPP in the slow axis direction.

The OC reflects respective first portions of the plurality of single laser beams back to the plurality of laser minibars (e.g., in a reverse propagation direction via the plurality of gratings, the plurality of SACs, and/or the plurality of FACs). In this way, respective portions of a plurality of laser beams emitted by a plurality of laser emitters of a laser minibar (e.g., that are part of the first portion of the single laser beam) are reflected back to the plurality of laser minibars to cause each laser minibar's plurality of laser emitters to be wavelength-locked. Accordingly, in this way, each laser emitter, of the plurality of laser minibars, is wavelength-locked. Further, the OC directs respective second portions of the plurality of single laser beams out of the optical module, such as to a fiber (e.g., to allow for coupling into the fiber).

In some implementations, one or more lenses are disposed along an optical path of the second portions of the plurality of single laser beams (hereinafter referred to as combined single laser beams). A first lens, of the one or more lenses, may be a coupling lens (e.g., a fast axis coupling lens (FCL)) that is configured to converge the combined single laser beams in a first direction (e.g., in a fast axis direction of the combined single laser beams), and/or a second lens, of the one or more lenses, may be a coupling lens (e.g., a slow axis coupling lens (SCL)) that is configured to converge the combined single laser beams in a second direction (e.g., in a slow axis direction of the combined single laser beams). This facilitates coupling of the combined single laser beam into the fiber. Because of the improved beam BPP by WBC, the optical module described herein therefore enhances module power and beam brightness by coupling more such combined single laser beams into the same fiber (e.g., using SBC).

In some implementations, a transform lens and a common grating are disposed along an optical path of the plurality of single laser beams between the plurality of gratings and the OC. The transform lens (e.g., a fast axis transform lens (FATL) or another type of transform lens) directs the plurality of single laser beams (e.g., by converging the plurality of single laser beams in the fast axis) to the common grating with orthogonal grating lines as compared to the first set of plurality of gratings, which combines the plurality of single laser beams into combined single laser beams that it directs to the OC. In this way, the transform lens and the common grating minimize a divergence of the plurality of single laser beams in the fast axis. Further, the OC may be disposed between a pair of lenses that collimate the combined single laser beams, which minimize divergence of the combined single laser beams in the fast axis. In this way, some implementations facilitate slow axis and fast axis WBC for laser minibars.

In some implementations, the stepped structure is configured to thermally conduct heat away from the laser minibars. That is, the stepped structure may be a heatsink (e.g., a passive heatsink), wherein each laser minibar is disposed on a particular step of the stepped structure, which allows the laser minibars to be spaced out in a distributed manner. Accordingly, heat that is generated by operating the laser minibars is dispersed across a large area of the stepped structure, which enables the stepped structure to effectively conduct the heat away from the laser minibars. Therefore, by removing heat from the laser minibars more efficiently, the laser minibars may be higher powered (e.g., as compared to laser minibars not distributed on a stepped structure), and a brightness of the laser beams emitted by the laser minibars may therefore be increased. Accordingly, a brightness of a single laser beam (e.g., that is a combination of the laser beams from one minbar laser) may also be increased, as well as a brightness of the combined single laser beams. Further, using distributed laser minibars instead of non-distributed laser minibars increases reliability of the optical module.

The optical module described herein therefore enhances module power and beam brightness, and thus dramatically improves dollar per watt ($/W) of the optical module. Some implementations described herein can be used as direct laser systems, such as for materials processing, including laser marking, welding, cutting, engraving, or selective sintering. Furthermore, the locked and adjustable spectra enabled by the optical module are advantageous for pump or direct diode applications.

Figure 1B:
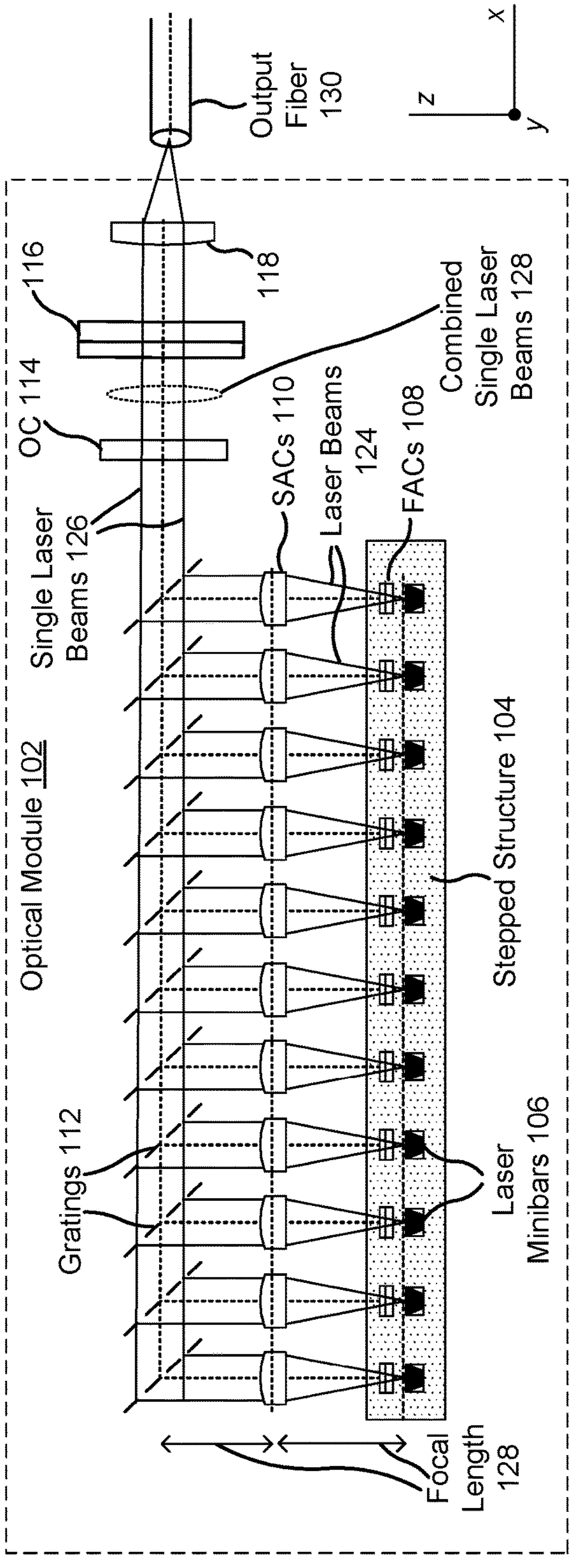

FIGS. 1A-1B are diagrams of an example implementation 100 described herein. As shown in FIGS. 1A-1B, the example implementation 100 comprises an optical module 102, which may include a stepped structure 104, a plurality of laser minibars 106, a plurality of FACs 108, a plurality of SACs 110, a plurality of gratings 112, an OC 114, a first lens 116, a second lens 118, and/or one or more other components. FIG. 1A shows a side view of the optical module 102, and FIG. 1B shows a top-down view of the optical module 102.

As shown in FIG. 1A, the stepped structure 104 may include a plurality of steps. That is, the stepped structure may be a "staircase" structure. Each step may be associated with a height 120 (e.g., from a bottom of the stepped structure 104 or a bottom surface of the optical module 102, in a vertical direction that is parallel to the y axis shown in FIG. 1). For example, each step may be associated with a particular height 120 that is different than respective heights 120 of the other steps of the plurality of steps of the stepped structure 104. Additionally, each step may be associated with a distance 122 (e.g., in a lateral direction, also referred to as a horizontal direction, that is parallel to the x axis shown in FIG. 1A) from the OC 114 (e.g., from an input surface of the OC 114, an output surface of the OC 114, or another portion of the OC 114). For example, each step may be associated with a particular distance from the OC 114 that is different than respective distances (e.g., from the OC 114) of the other steps of the plurality of steps of the stepped structure 104.

In some implementations, the stepped structure 104 may be configured to thermally conduct heat (e.g., that is generated by one or more other components of the optical module 102) away from the optical module 102. That is, the stepped structure 104 may be a heatsink (e.g., a passive heatsink). For example, as shown in FIG. 1A, the stepped structure 104 may be configured to thermally conduct heat in a vertical direction (e.g., in a downward direction that is parallel to the y axis shown in FIG. 1A) from the optical module 102 to another component or system external the optical module 102 (not pictured in FIG. 1A), such as to another heatsink or to another thermally conductive element that is below the stepped structure 104. In this way, the stepped structure 104 may be configured to facilitate dissipation of heat generated by the optical module 102 and thereby enable temperature regulation of the optical module 102.

Each laser minibar 106, of the plurality of laser minibars 106, may be from 0.4 to 5.0 millimeters (mm) wide (e.g., greater than or equal to 0.4 mm and less than or equal to 5.0 mm), and may include a plurality of laser emitters arranged in a single row along the x axis shown in FIG. 1A, all parallel to each other and emitting in the z axis. For example, a laser minibar 106 may include a plurality of laser emitters arranged in a one-dimensional array. In some implementations, a pitch between adjacent emitters of the plurality of laser emitters (e.g., within the one-dimensional array) may be less than or equal to a pitch threshold. The pitch threshold may be, for example, in a range from 5 to 50 micrometers (μm). As a specific example, the pitch threshold may be 30 um (e.g., where a respective width of the plurality of laser emitters is from 15 to 20 μm). In some implementations, a quantity of the plurality of laser emitters may be, for example, in a range from 5 to 1000. As a specific example, the quantity of the plurality of laser emitters may be from 60 to 100 (e.g., (e.g., where a respective width of the plurality of laser emitters is from 15 to 20 μm). In some implementations, each laser minibar 106 may include a same quantity of laser emitters.

Each laser minibar 106 may be configured to emit a plurality of laser beams 124. That is, each laser emitter, of a plurality of laser emitters of a laser minibar 106, may be configured to emit a laser beam 124 (e.g., in a direction that is parallel to the z axis shown in FIG. 1A). For example, each laser emitter may emit a laser beam 124 that is associated with a particular wavelength (e.g., centered at the particular wavelength, such as after being wavelength locked, as described herein) that is different than respective wavelengths of laser beams 124 emitted by other laser emitters of the plurality of laser emitters of the laser minibar 106. In some implementations, each laser emitter, of the plurality of laser emitters, may be configured to be wavelength-locked at a particular wavelength (e.g., within a tolerance, which may be less than or equal to 1 nanometer (nm)) at which the laser emitter is configured to emit a laser beam 124 (e.g., due to a portion of the laser beam 124 that is reflected back to the laser emitter, such as by the OC 114, as further described herein). Accordingly, because the plurality of laser emitters may be configured to be wavelength-locked, in some implementations, the plurality of laser emitters of the laser minibar 106 may be configured to emit laser beams within a same wavelength range (e.g., with a range width that is less than or equal to 10 nm, 15 nm, 20 nm, 25 nm, 30 nm, or 35 nm), where each laser emitter is configured to be wavelength-locked at a particular wavelength (e.g., within the tolerance) within the wavelength range.

In some implementations, each laser emitter, of a plurality of emitters, of a laser minibar 106 may be a single mode laser emitter (e.g., a single mode laser diode). The laser emitter may emit a laser beam 124 with an emission width (e.g., in a slow axis direction, which may be parallel to the x axis shown in FIG. 1B, prior to the laser beam 124 being redirected by a grating 112, as described herein) that is less than or equal to an emission width threshold. The emission width threshold may be, for example, in a range from 2 to 50 μm.

Each laser minibar 106 may be disposed on a step of the stepped structure 104. For example, as shown in FIG. 1A, each laser minibar 106 may be disposed on a particular step of the stepped structure 104 that is different than other steps of the stepped structure 104 on which other laser minibars 106 are disposed. Accordingly, each laser minibar 106 may be associated with a particular height 120 (e.g., from the bottom surface of the stepped structure 104) and a particular distance 122 (e.g., from the OC 114) of the particular step on which the laser minibar 106 is disposed. In some implementations, each laser minibar 106 may be disposed on a corresponding submount (not shown in FIGS. 1A-1B) that is disposed on the particular step of the stepped structure 104.

In some implementations, the stepped structure 104 may be configured to thermally conduct heat that is generated by the plurality of laser minibars 106 (e.g., due to operation of the plurality of laser minibars 106) disposed on the plurality of steps of the stepped structure 104 away from the optical module 102. Further, because each laser minibar 106 may be disposed on a corresponding step of the stepped structure 104, the plurality of laser minibars 106 may be physically spaced apart (e.g., in the lateral direction, or horizontal direction, that is parallel to the x axis shown in FIGS. 1A-1B) across the stepped structure 104, which allows portions of the stepped structure 104 (e.g., that are associated with the steps of the stepped structure 104) to respectively thermally conduct heat generated by the plurality of laser minibars 106. Accordingly, the stepped structure 104 is able to provide an improved thermal conductivity performance as compared to not using a heatsink. Therefore, the plurality of laser minibars 106 may be higher powered (e.g., as compared to laser minibars 106 that are not spatially dispersed on a stepped structure), and respective brightnesses of the plurality of laser beams 124 may therefore be increased.

Each laser beam 124 may propagate via an optical path from a laser emitter, of a laser minibar 106, that emitted the laser beam 124 to the OC 114 (e.g., to the input surface of the OC 114) via a FAC 108, a SAC 110, and a grating 112 (e.g., each of which correspond to the laser minibar 106, as further described herein). For example, each laser beam 124 may transmit via a particular optical path to the OC 114 that is different than optical paths propagated by other laser beams 124 from other different laser minibars 106. This may be due to the plurality of laser minibars 106 being associated with different respective heights 120 and distances 122, and laser emitters of each laser minibar 106 being arranged in a one-dimensional array within the laser minibar 106.

As shown in FIG. 1B, the plurality of FACs 108 may correspond to the plurality of laser minibars 106. For example, each FAC 108 may be associated with a particular laser minibar 106. As shown in FIG. 1B, a FAC 108 may be disposed along an optical path of a plurality of laser beams 124 emitted from a corresponding laser minibar 106 (e.g., from a central laser emitter of the laser minibar 106), of the plurality of laser minibars 106, between the corresponding laser minibar 106 and a corresponding SAC 110 of the plurality of SACs 110. In some implementations, a FAC 108 that corresponds to a laser minibar 106 may be disposed on the submount (not shown in FIGS. 1A-1B) of the laser minibar 106 to ensure that the FAC 108 is positioned and/or aligned between the laser minibar 106 and a corresponding SAC 110. Accordingly, each FAC 108 may be associated with the height 120 of the laser minibar 106 to which the FAC 108 corresponds (e.g., to the height 120 of the step of the stepped structure 104 on which the laser minibar 106 is disposed).

Each FAC 108 may be configured to receive and to collimate the plurality of laser beams 124 emitted from a corresponding laser minibar 106 of the plurality of laser minibars 106. For example, the FAC 108 may collimate the laser beams 124 in the fast axis (e.g., that is parallel to the y axis shown in FIGS. 1A-1B). The FAC 108 may be further configured to direct the laser beam 124 to a SAC 110 (e.g., that corresponds to the laser minibar 106). In some implementations, the FAC 108 may be configured to direct the laser beam 124 to the SAC 110 via one or more other components of the optical module 102, such as via one or more optical elements (e.g., one or more lenses, one or more reflectors, and/or one or more other optical elements).

As shown in FIG. 1B, the plurality of SACs 110 may correspond to the plurality of laser minibars 106. For example, each SAC 110 may be associated with a particular laser minibar 106 (and/or to a particular FAC 108). As shown in FIG. 1B, a SAC 110 may be disposed along an optical path of a laser beam 124 emitted from a corresponding laser minibar 106 (e.g., from a laser emitter of the laser minibar 106), of the plurality of laser minibars 106, between a FAC 108 associated with the corresponding laser minibar 106 and a corresponding grating 112. In some implementations, a SAC 110 that corresponds to a laser minibar 106 may be disposed on a submount (not shown in FIGS. 1A-1B) of the laser minibar 106 to ensure that the SAC 110 is positioned and/or aligned between the FAC 108 and the corresponding grating 112. Accordingly, each SAC 110 may be associated with a height 120 of the laser minibar 106 to which the SAC 110 corresponds (e.g., to the height 120 of the step of the stepped structure 104 on which the laser minibar 106 is disposed).

Each SAC 110 may be configured to receive and to collimate the plurality of laser beams 124 emitted from the plurality of laser emitters of a corresponding laser minibar 106 of the plurality of laser minibars 106) (e.g., after a corresponding FAC 108 collimates the laser beams 124). For example, the SAC 110 may collimate the laser beams 124 in a slow axis (e.g., that is parallel to the x axis shown in FIG. 1A-1B, prior to the laser beam 124 being redirected by a grating 112, as described herein), such as after a corresponding FAC 108 collimates the laser beam 124 in the fast axis (e.g., that is parallel to the y axis shown in FIGS. 1A-1B). The SAC 110 may be further configured to direct the laser beam 124 to a grating 112 (e.g., that corresponds to the laser minibar 106). In some implementations, the SAC 110 may be configured to direct the laser beam 124 to the grating 112 via one or more other components of the optical module 102, such as via one or more optical elements (e.g., one or more lenses, one or more reflectors, and/or one or more other optical elements).

As shown in FIG. 1B, the plurality of gratings 112 may correspond to the plurality of laser minibars 106. For example, each grating 112 may be associated with a particular laser minibar 106 (and/or to a particular FAC 108 and/or to a particular SAC 110). As shown in FIG. 1B, a grating 112 may be disposed along an optical path of a laser beam 124 emitted from a corresponding laser minibar 106 (e.g., from a laser emitter of the laser minibar 106), of the plurality of laser minibars 106, between a SAC 110 associated with the corresponding laser minibar 106 and the OC 114. In some implementations, a grating 112 that corresponds to a laser minibar 106 may be disposed on a submount (not shown in FIGS. 1A-1B) of the laser minibar 106 to ensure that the grating 112 is positioned and/or aligned between the SAC 110 and the OC 114. Accordingly, each grating 112 may be associated with a height 120 of the laser minibar 106 to which the grating 112 corresponds (e.g., to the height 120 of the step of the stepped structure 104 on which the laser minibar 106 is disposed).

Each grating 112 may be configured to receive a plurality of laser beams 124 (e.g., the plurality laser beams 124 emitted by a corresponding laser minibar 106 of the plurality of laser minibars 106). The grating 112 may be a diffractive grating, a transmission grating, a diffractive transmission grating, or another type of grating, and therefore may be configured to combine (e.g., using WBC) the plurality of laser beams 124 from the corresponding laser minibar 106 into a single laser beam 126. The single laser beam 126 may have high power (e.g., a combination of respective powers of the plurality of laser beams 124) and, therefore, high brightness. Further, the grating 112 may be configured to direct the corresponding single laser beam 126 to the OC 114.

The plurality of gratings 112 may be physically arranged (e.g., vertically relative to one another, in they axis shown in FIGS. 1A-1B) so that the plurality of single laser beams 126 (e.g., one single laser beam 126 from each grating) are spatially coordinated (e.g., the plurality of single laser beams form a non-overlapping stack when viewed on the optical axis of the OC 114). For example, the plurality of gratings 112 may spatially combine the plurality of single laser beams (e.g., in a non-overlapped stack) when directing the plurality of single laser beams 126 to the OC 114. In this way, the plurality of gratings 112 may provide SBC of the plurality of single laser beams 126 (e.g., concurrent to, and independent of, providing WBC of the plurality of laser beams 124 into the plurality of single laser beams 126).

As shown in FIG. 1B, each SAC 110, may be positioned at a particular distance from a corresponding laser minibar 106 (e.g., an emission surface of the laser minibar 106). As shown in FIG. 1B, the particular distance may be equal to a focal length 128 of the SAC 110 (e.g., within a tolerance, which may be less than or equal to 1% of the focal length 128). Additionally, or alternatively, each grating 112 may be positioned at a particular distance from a corresponding SAC 110 (e.g., from a focal plane of the SAC 110). As shown in FIG. 1B, the particular distance may be equal to the focal length 128 of the SAC 110 (e.g., within the tolerance). This may allow the grating 112 to convert respective angular and wavelength characteristics of the plurality of laser beams 124 (e.g., in a slow axis of the plurality of laser beams 124) into combined wavelength characteristics of the single laser beam 126 (e.g., in a slow axis of the single laser beam 126). The grating 112 is able to receive and overlap respective NF characteristics and/or respective FF characteristics of the plurality of laser beams 124 to form the single laser beam 126. Accordingly, this allows the single laser beam 126 to have an improved BPP.

Accordingly, as further shown in FIG. 1B, each FAC 108, of the plurality of FACs 108, may be configured to receive a plurality of laser beams 124 emitted by a corresponding laser minibar 106, to collimate the plurality of laser beams 124 in a first direction (e.g., in a fast axis direction of the plurality of laser beams 124), and to direct the plurality of laser beams 124 to a SAC 110, of the plurality of SACs 110, that corresponds to the laser minibar 106. Each SAC 110, of the plurality of SACs 110, may be configured to receive a plurality of laser beams 124 that are collimated in the first direction by a FAC 108, of the plurality of FACs 108, that corresponds to a laser minibar 106 that emitted the plurality of laser beams 124, to collimate the plurality of laser beams in a second direction (e.g., that is different than the first direction, such as in a slow axis direction of the plurality of laser beams 124), and to direct the plurality of laser beams 124 to a grating 112, of the plurality of gratings 112, that corresponds to the laser minibar 106. Each grating 112, of the plurality of gratings 112, may be configured to receive a plurality of laser beams 124 that are collimated in the first direction by a FAC 108, of the plurality of FACs 108, that corresponds to a laser minibar 106 that emitted the plurality of laser beams 124, and that are collimated in the second direction by a SAC 110, of the plurality of SACs 110, that corresponds to the laser minibar 106. The grating 112 may also be configured to combine (e.g., using WBC) the plurality of laser beams 124 into a single laser beam 126, and to direct the single laser beam to the OC 114.

The plurality of gratings 112 may therefore respectively direct a plurality of single laser beams 126 to the OC 114. As described above, the plurality of gratings 112 may be arranged relative to each other such that the plurality of single laser beams 126 directed to the OC 114 are spatially coordinated, forming a non-overlapping stack with gaps as combined single laser beams 128. In this way, the plurality of gratings 112 may be configured to spatially combine the plurality of single laser beams 126 (e.g., in a non-overlapped stack) when directing the plurality of single laser beams 126 to the OC 114. For example, the plurality of gratings 112 may direct the plurality of single laser beams 126 to the OC 114 such that the plurality of single laser beams 126 impinge on the OC 114 in a stack, or column, where adjacent single laser beams 126 are separated by a gap, as described herein. In this way, the plurality of gratings 112 may be configured to provide SBC of the plurality of single laser beams 126 (e.g., in addition to providing WBC of the plurality of laser beams 124 into the plurality of single laser beams 126).

The OC 114 may be configured to receive respective single laser beams 126 from the plurality of gratings 112. In some implementations, the OC 114 may be configured to receive the plurality of single laser beams 126 as spatially combined single laser beams (e.g., as a non-overlapped stack, or a non-overlapped column). For example, the OC 114 may include a plurality of portions that are configured to receive the plurality of single laser beams 126, respectively. Each portion of the OC 114 may be covered with a coating, such as a partially reflective (PR) coating (e.g., to reflect a first portion of a laser beam, and to pass a second portion of a laser beam, as described herein).

Additionally, or alternatively, adjacent portions of the OC 114 may be separated by a gap. A size of the gap (e.g., a distance between respective edges of adjacent portions of the OC 114) may be less than or equal to a size threshold. The size threshold may be, for example, with a range from 50 to 400 μm. Each gap may be configured to prevent a particular portion of the OC 114 from receiving any portion of a single laser beam 126 that the particular portion of the OC 114 is not configured to receive (e.g., receiving any portion of a single laser beam 126 that is to be received by a portion of the OC 114 that is adjacent to the particular portion of the OC 114). This may cause the OC 114 to be configured to not reflect some of a particular single laser beam 126 to any laser minibar 106 not associated with the single laser beam 126 (e.g., any laser minibar 106 that did not emit a plurality of laser beams 124 that are included in the particular single laser beam 126), as further described herein. Further, each gap may be covered with a coating, such as an anti-reflective (AR) coating, to minimize an amount of reflection of any single laser beam 126 that impinges on the gap.

Further, the OC 114 may be configured to reflect respective first portions of the plurality of single laser beams 126 back to the plurality of laser minibars 106 (e.g., in a reverse propagation direction via the plurality of gratings 112, the plurality of SACs 110, and/or the plurality of FACs 108). A first portion of a single laser beam 126 may include less than or equal to a particular percentage of the single laser beam 126, wherein the particular percentage is, for example, from 1 to 15%. In this way, respective portions of the plurality of laser beams 124 emitted by a plurality of laser emitters of a laser minibar 106 (e.g., that are part of the first portion of the single laser beam 126) may be reflected back to the plurality of laser emitters to cause the plurality of laser emitters to be wavelength-locked. In this way, each laser emitter, of the plurality of laser minibars 106, may be wavelength-locked.

For example, a particular laser emitter, of a laser minibar 106, may emit a particular laser beam 124 associated with a particular wavelength, which may propagate to the OC 114 as part of a particular single laser beam 126 (in a similar manner as described elsewhere herein). The OC 114 may reflect a portion of the particular single laser beam 126, which includes a portion of the particular laser beam 124. This causes the portion of the particular laser beam 124 to propagate to the particular laser emitter and thereby causes the particular laser emitter to be wavelength-locked at the particular wavelength. Accordingly, each laser emitter, of a laser minibar 106, may be wavelength-locked at a particular wavelength due to the height 120 of the laser minibar 106, a length of an optical path of a laser beam 124 emitted by the laser emitter (e.g., from the laser emitter to the OC 114), an angle at which the laser beam 124 impinges on the OC 114 (e.g., after propagating from the laser emitter to the OC 114 via a corresponding FAC 108, a corresponding SAC 110, and a corresponding grating 112), and/or a distance of the grating 112 from the SAC 110 and/or a distance of the SAC 110 from the laser minibar 106.

Accordingly, in some implementations, each laser emitter, of a laser minibar 106, may be wavelength-locked at a particular wavelength (e.g., within a tolerance, which may be less than or equal to 1 nm) that is different than respective wavelengths at which other laser emitters of the laser minibar 106 are wavelength-locked. In some implementations, a plurality of laser emitters of a laser minibar 106 may be wavelength-locked within a wavelength range (e.g., each laser emitter may be wavelength-locked at a particular wavelength that is greater than or equal to a minimum of the wavelength-lock range and that is less than or equal to a maximum of the wavelength-locked range). A width of the wavelength-locked range (e.g., a difference between the maximum and the minimum of the wavelength-locked range) may be less than or equal to a width threshold. The width threshold may be, for example, from 2 to 30 nm.

Additionally, or alternatively, as shown in FIG. 1A-1B, the OC 114 may be configured to direct respective second portions of the plurality of single laser beams 126 (e.g., as a combined laser beam) out of the optical module 102. For example, the OC 114 may be configured to direct a remainder of the plurality of single laser beams 126 (e.g., that are not reflected by the OC 114) out of the optical module 102. In some implementations, the OC 114 may cause the respective second portions of the plurality of single laser beams 126 (hereinafter referred to as combined single laser beams 128) to be emitted from the optical module 102 to an output fiber 130 (e.g., that is an output fiber of a fiber coupled optical module).

In some implementations, the OC 114 may be configured to direct the combined single laser beams 128 out of the optical module 102 via one or more other components of the optical module 102, such as via one or more optical elements (e.g., one or more lenses, one or more reflectors, and/or one or more other optical elements). For example, the OC 114 may be configured to direct the combined single laser beams 128 out of the optical module 102 via the first lens 116 and/or the second lens 118.

As shown in FIGS. 1A-1B, in some implementations, the first lens 116 and/or the second lens 118 may be disposed along an optical path of the combined single laser beams 128 (e.g., that is provided by the OC 114) between the OC 114 and the output fiber 130. The first lens 116 and/or the second lens 118 may be configured (e.g., individually, or in combination) to receive the combined single laser beams 128 and to direct the combined single laser beams 128 to the output fiber 130. For example, the first lens 116 may be an FCL that is configured to converge the combined single laser beams 128 on the second lens 118 or the output fiber 130 in a first direction (e.g., converge the combined single laser beams 128 in a fast axis direction of the combined single laser beams 128, which is parallel to they axis shown in FIGS. 1A-1B). As an additional, or alternative example, the second lens 118 may be an SCL that is configured to converge the combined single laser beams 128 on the output fiber 130 in a second direction (e.g., converge the combined single laser beams 128 in a slow axis direction of the combined single laser beams 128, which is approximately parallel to the z axis shown in FIGS. 1A-1B). In some implementations, the first lens 116 and/or the second lens 118 may be configured to direct the combined single laser beams 128 to the output fiber 130 via one or more other components of the optical module 102, such as via one or more optical elements (e.g., one or more lenses, one or more reflectors, and/or one or more other optical elements).

FIGS. 1A-1B are provided as an example. Other examples may differ from what is described with regard to FIGS. 1A-1B.

Figure 2A:
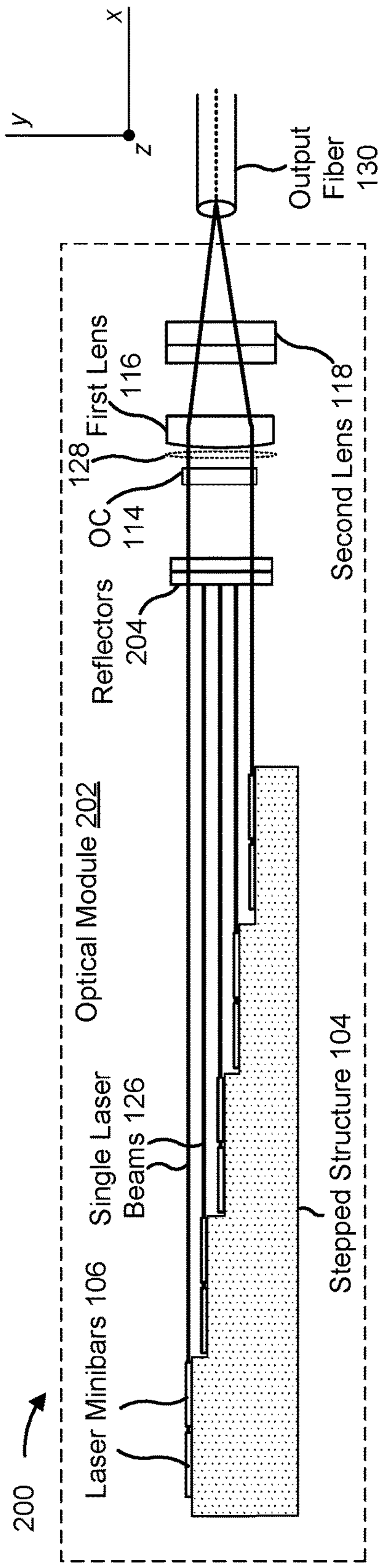
FIGS. 2A-2B are diagrams of an example implementation described herein.
Figure 2B:
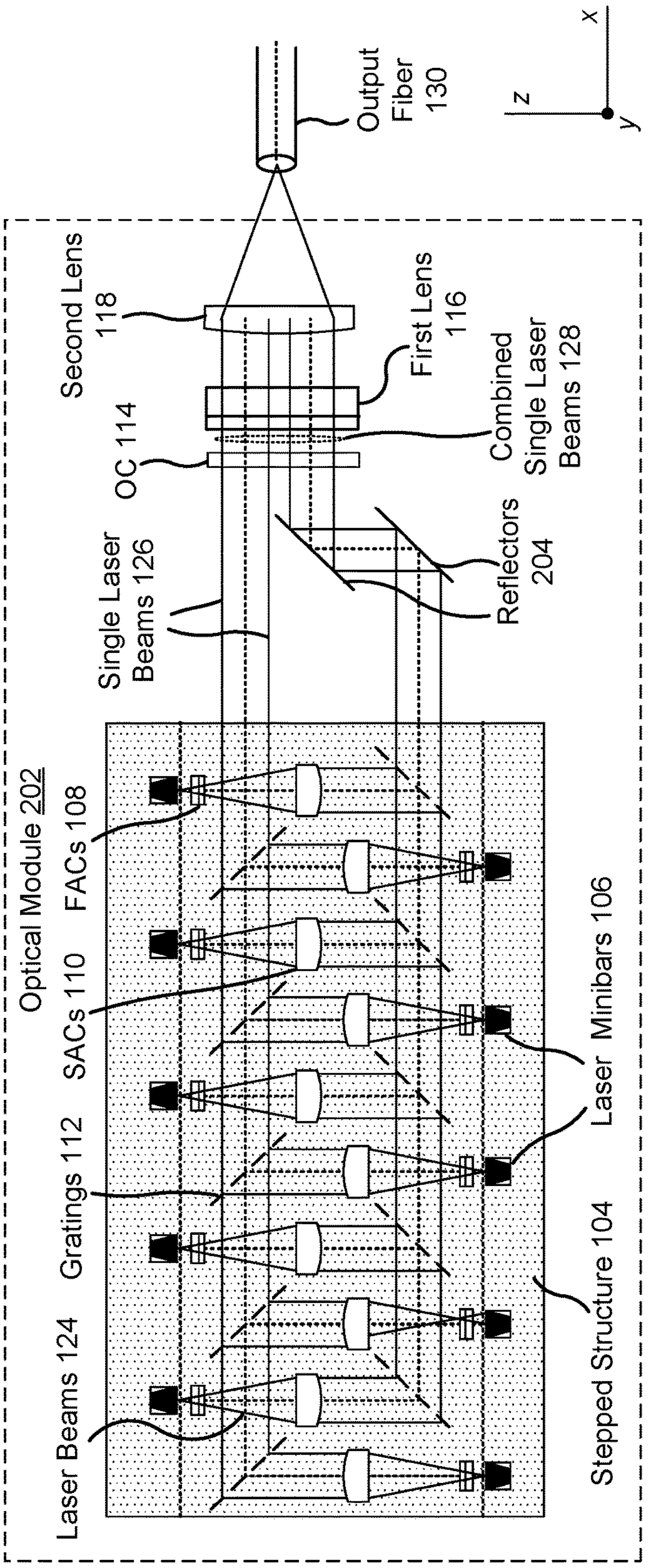

FIGS. 2A-2B are diagrams of an example implementation 200 described herein. As shown in FIGS. 2A-2B, the example implementation 200 comprises an optical module 202. The optical module 202 may be similar to the optical module 102, and may therefore include the stepped structure 104, the plurality of laser minibars 106, the plurality of FACs 108, the plurality of SACs 110, the plurality of gratings 112, the OC 114, the first lens 116, and/or the second lens 118 (e.g., configured in a similar manner as that described herein in relation to FIGS. 1A-1B). As further shown in FIGS. 2A-2B, the optical module 202 may also include one or more other components, such as a plurality of reflectors 204. FIG. 2A shows a side view of the of the optical module 202, and FIG. 2B shows a top-down view of the optical module 202.

As shown in FIG. 2B, the plurality of laser minibars 106 may be configured as multiple columns (e.g., two columns that extend in the lateral direction, or horizontal direction, that is parallel to the x axis shown in FIGS. 2A-2B). Accordingly, two laser minibars 106 (one from each column), of the plurality of laser minibars 106, may be disposed on a same step of the stepped structure 104. For example, as shown in FIGS. 2A-2B, a laser minibar 106 from a first column (the top column shown in FIG. 2B) may be disposed on a same step (as shown in FIG. 2A) of the stepped structure 104 as a laser minibar 106 from a second column (the bottom column shown in FIG. 2B). Accordingly, each pair of laser minibars 106 may be associated with a particular height 120 (e.g., from the bottom surface of the stepped structure 104) of the particular step on which the pair of laser minibars 106 is disposed. In some implementations, each pair of laser minibars 106 may be disposed on a corresponding submount (not shown in FIGS. 2A-2B) that is disposed on the particular step of the stepped structure 104.

As further shown in FIG. 2B, each laser minibar 106 may be positioned to emit (e.g., using a plurality of laser emitters of the laser minibar 106) a plurality of laser beams 124 toward a central portion of the stepped structure 104. For example, a first laser minibar 106 from the first column may be configured to emit a first plurality of laser beams 124 in a first direction (e.g., a downward direction, that is parallel to the z axis shown in FIG. 2B) toward the central portion of the stepped structure 104, and a second laser minibar 106 from the second column may be configured to emit a second plurality of laser beams 124 in a second direction (e.g., an upward direction, that is parallel to the z axis shown in FIG. 2B) toward the central portion of the stepped structure 104.

In some implementations, respective laser emitters of laser minibars 106 in each column of the plurality of laser minibars 106 may be wavelength-locked within a same wavelength-locked range (e.g., laser emitters of each laser minibar 106 of each column may be wavelength-locked at a particular wavelength that is greater than or equal to a minimum of the wavelength-locked range and that is less than or equal to a maximum of the wavelength-locked range). A width of the wavelength-locked range (e.g., a difference between the maximum and the minimum of the wavelength-locked range) may be less than or equal to a width threshold. The width threshold may be, for example, from 2 to 30 nm. Alternatively, the columns of the plurality of laser minibars 106 may include laser emitters that are wavelength-locked within different, or only partially overlapping, wavelength-locked ranges.

In a similar manner as described herein in relation to FIGS. 1A-1B, each column of the plurality of laser minibars 106 may emit a plurality of laser beams 124. The plurality of laser beams 124 then may propagate to the OC 114 via the plurality of FACs 108, the plurality of SACs 110, and the plurality of gratings 112 (e.g., that combine the plurality of laser beams 124 into a plurality of single laser beams 126), in a similar manner as described herein.

As shown in FIG. 2B, the plurality of reflectors 204 may correspond to a particular column of the plurality of laser minibars 106 (e.g., the bottom column shown in FIG. 2B). The plurality of reflectors 204 may be configured to receive respective single laser beams 126 from a plurality of gratings 112 that correspond to the particular column of the plurality of laser minibars 106. For example, each reflector 204 may be disposed along an optical path of each single laser beam 126 directed to the reflector 204 by a grating 112 associated with a laser minibar 106 of the particular column. The plurality of reflectors 204 may be configured to change a propagation direction of the plurality of single laser beams 126 associated with the column such that the plurality of single laser beams 126 are turned one or more times to allow the plurality of single laser beams 126 to propagate to the OC 114. Including the plurality of reflectors 204 is optional, where their inclusion enables folded optical paths of a plurality of single laser beams 126 (e.g., that are associated with the particular column of minibars 106) for a more compact optical module 202.

Accordingly, in a similar manner as that described herein in relation to FIGS. 1A-1B, the OC 114 may be configured to receive respective single laser beams 126 from the plurality of gratings 112. For example, the OC 114 may be configured to receive a first set of single laser beams 126 that are associated with a first column of laser minibars 106 (e.g., the top column of laser minibars 106) and to receive a second set of single laser beams 126 that are associated with a second column of laser minibars 106 (e.g., the bottom column of laser minibars 106). Further, the OC 114 may be configured to reflect respective first portions of the plurality of single laser beams 126 back to the plurality of laser minibars 106. For example, the OC 114 may reflect the first set of single laser beams 126, in a reverse propagation direction via the plurality of gratings 112, the plurality of SACs 110, and/or the plurality of FACs 108 associated with the first column of laser minibars 106, to the first column of laser minibars 106. As another example, the OC 114 may reflect the second set of single laser beams 126, in a reverse propagation direction via the plurality of reflectors 204, the plurality of gratings 112, the plurality of SACs 110, and/or the plurality of FACs 108 associated with the second column of laser minibars 106, to the second column of laser minibars 106. Additionally, or alternatively, the OC 114 may be configured to direct respective second portions of the plurality of single laser beams 126 (e.g., as a combined laser beam) out of the optical module 102, such as to the output fiber 130 (e.g., via the first lens 116 and/or the second lens 118).

FIGS. 2A-2B are provided as an example. Other examples may differ from what is described with regard to FIGS. 2A-2B.

Figure 3A:
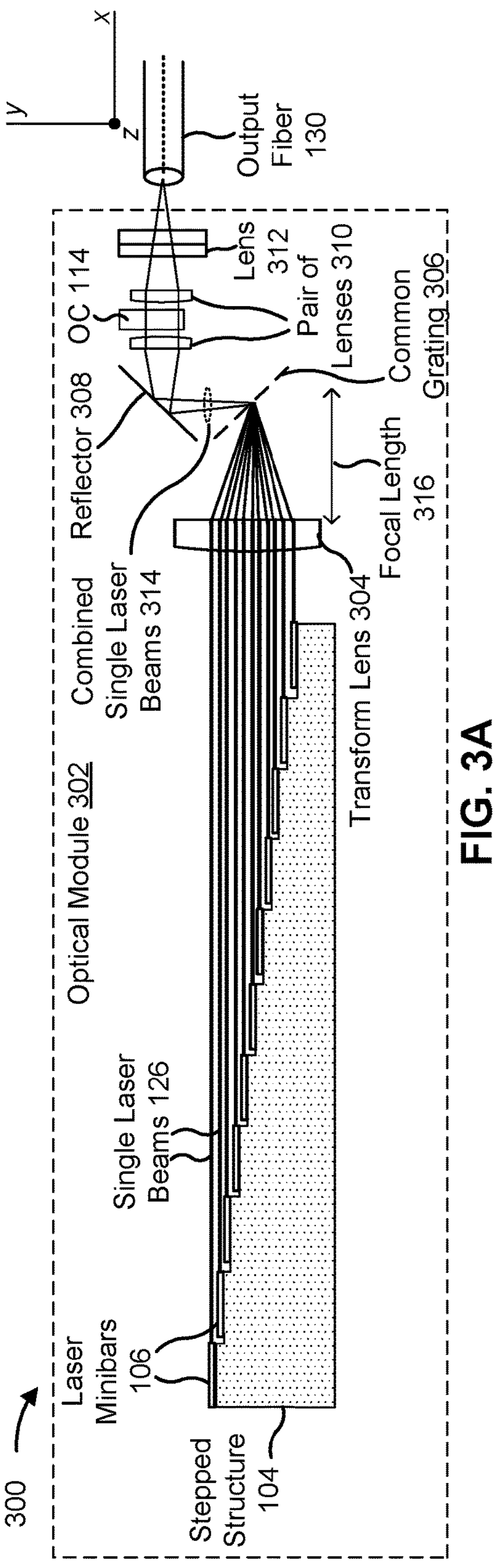
FIGS. 3A-3B are diagrams of an example implementation described herein.
Figure 3B:
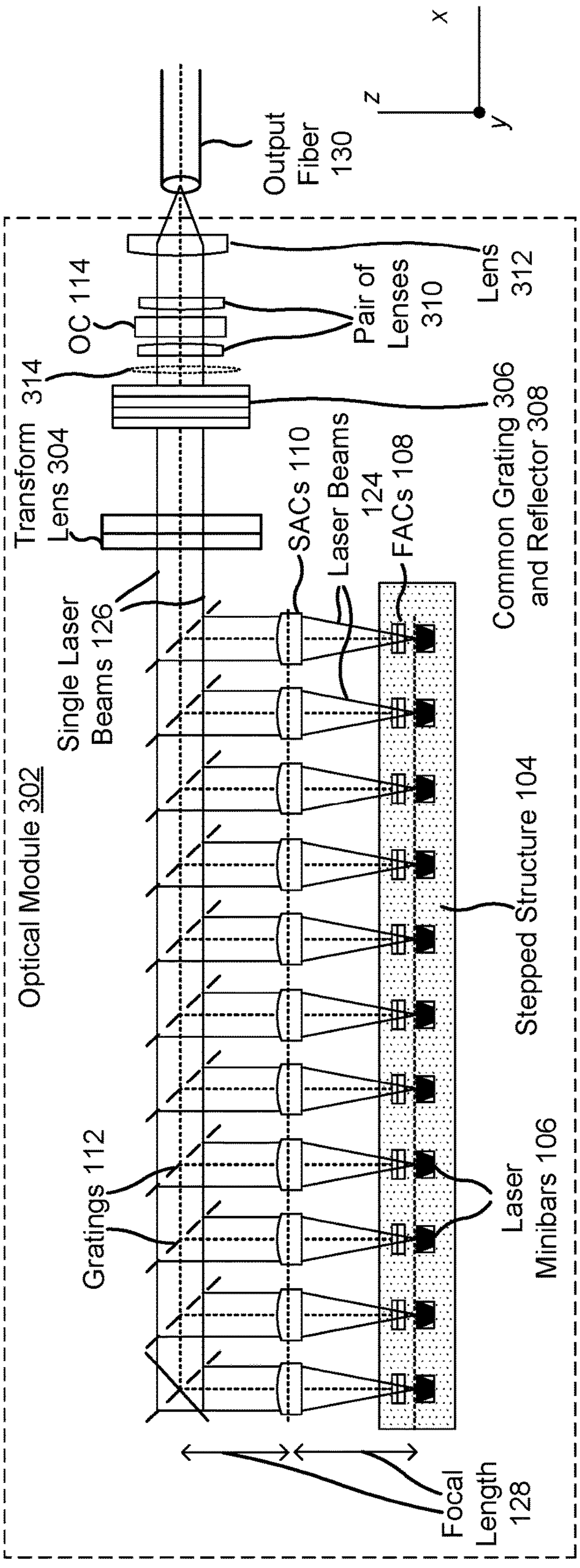

FIGS. 3A-3B are diagrams of an example implementation 300 described herein. As shown in FIGS. 3A-3B, the example implementation 300 comprises an optical module 302. The optical module 302 may be similar to the optical module 102 and/or the optical module 202, and may therefore include the stepped structure 104, the plurality of laser minibars 106, the plurality of FACs 108, the plurality of SACs 110, the plurality of gratings 112, and/or the OC 114 (e.g., configured in a similar manner as that described herein in relation to FIGS. 1A-1B and FIGS. 2A-2B). As further shown in FIGS. 3A-3B, the optical module 302 may also include one or more other components, such as a transform lens 304, a common grating 306, a reflector 308, a pair of lenses 310, and a lens 312. FIG. 3A shows a side view of the of the optical module 302, and FIG. 3B shows a top-down view of the optical module 302.

As shown in FIGS. 3A-3B, the stepped structure 104, the plurality of laser minibars 106, the plurality of FACs 108, the plurality of SACs 110, and the plurality of gratings 112 may be configured in a similar manner as that described herein in relation to FIGS. 1A-1B. Accordingly, the plurality of laser minibars 106 may be configured to emit a plurality of laser beams 124, which may propagate to the plurality of gratings 112 via the plurality of FACs 108 and the plurality of SACs 110. The plurality of gratings 112 may be configured to combine the plurality of laser beams 124 into a plurality of single laser beams 126.

As shown in FIGS. 3A-3B, the plurality of gratings 112 may be configured to direct the plurality of single laser beams 126 to the transform lens 304. In this way, the plurality of gratings 112 may be configured to spatially combine the plurality of single laser beams 126 (e.g., in a non-overlapped stack, or a non-overlapped column) when directing the plurality of single laser beams 126 to the transform lens 304. For example, the plurality of gratings 112 may direct the plurality of single laser beams 126 to the transform lens 304 such that the plurality of single laser beams 126 impinge on the transform lens 304 in a stack, or column, where adjacent single laser beams 126 are separated by a gap, such as in a similar manner as that described elsewhere herein. In this way, the plurality of gratings 112 may be configured to provide SBC of the plurality of single laser beams 126 (e.g., in addition to providing WBC of the plurality of laser beams 124 into the plurality of single laser beams 126).

The transform lens 304 may be configured to receive the plurality of single laser beams 126 from the plurality of gratings 112. Further, the transform lens 304 may be configured to direct the plurality of single laser beams 126 to the common grating 306. For example, the transform lens 304 may be a converging lens (e.g., a Fourier transform lens, an FATL, and/or another type of converging lens) that is configured to converge the plurality of single laser beams 126 on the common grating 306 (e.g., converge the plurality of single laser beams 126 in the fast axis, which is parallel to the y axis shown in FIGS. 3A-3B). In some implementations, the transform lens 304 may be configured to direct the plurality of single laser beams 126 to the common grating 306 via one or more other components of the optical module 102, such as via one or more optical elements (e.g., one or more lenses, one or more reflectors, and/or one or more other optical elements).

The common grating 306 may be configured to receive the plurality of single laser beams 126, such as from the transform lens 304. The common grating 306 may be a diffractive grating, a transmission grating, a diffractive transmission grating, or another type of grating, and therefore may be configured to combine (e.g., using WBC) the plurality of single laser beams 126 into combined single laser beams 314. The combined single laser beams 314 may have high power (e.g., a combination of respective powers of the plurality of single laser beams 126) and, therefore, high brightness. Further, the common grating 306 may be configured to direct the combined single laser beams 314 to the OC 114. In some implementations, the common grating 306 may be configured to direct the combined single laser beams 314 to the OC 114 via one or more other components of the optical module 102, such as via one or more optical elements (e.g., one or more lenses, one or more reflectors, and/or one or more other optical elements). For example, the common grating 306 may be configured to direct the combined single laser beams 314 to the OC 114 via the reflector 308.

In some implementations, the common grating 306 may be positioned at a particular distance from the transform lens 304. As shown in FIGS. 3A-3B, the particular distance may be equal to a focal length 316 of the transform lens 304 (e.g., within a tolerance, which may be less than or equal to 1% of the focal length 316). This may allow the common grating 306 to convert respective angular and wavelength characteristics of the plurality of single laser beams 126 into combined wavelength characteristics of the combined single laser beams 314. The common grating 306 is able to receive and overlap respective NF characteristics and/or respective FF characteristics of the plurality of single laser beams 126 to form the combined single laser beams 314. Accordingly, this allows the combined single laser beams 314 to have an improved BPP.

As shown in FIG. 3A, the reflector 308 may be disposed along an optical path of the combined single laser beams 314 (e.g., that is formed by the common grating 306) between the common grating 306 and the OC 114. The reflector 308 may be configured to receive the combined single laser beams 314 and to direct the combined single laser beams 314 to the OC 114. For example, the reflector 308 may be a mirror (e.g., a turning mirror) that is configured to change a propagation direction of the combined single laser beams 314 such that the combined single laser beams 314 are directed to the OC 114. The reflector 308 is optional, where its inclusion enables a folded optical path of the combined single laser beams 314 for a more compact optical module 302.

The OC 114 may be configured in a similar manner as that described herein in relation to FIGS. 1A-1B and 2A-2B. For example, the OC 114 may be configured to receive the combined single laser beams 314 and reflect a first portion of the combined single laser beams 314 back to the plurality of laser minibars 106 (e.g., to wavelength-locked laser emitters of the plurality of laser minibars 106), and to direct a second portion of the combined single laser beams 314 out of the optical module 302, such as to the output fiber 130.

In some implementations, the OC 114 may be associated with the pair of lenses 310. As shown in FIGS. 3A-3B, the OC 114 may be positioned between the pair of lenses 310, and the pair of lenses 310 may be configured to collimate the combined single laser beams 314 in a first direction (e.g., in a fast axis direction of the combined single laser beams 314, which may be parallel to the y axis shown in FIGS. 3A-3B). That is, a first lens of the pair of lenses 310 may collimate the combined single laser beams 314 prior to the combined single laser beams 314 propagating to the OC 114, and a second lens of the pair of lenses 310 may collimate the second portion of the combined single laser beams 314 that is provided by the OC 114.

As shown in FIGS. 3A-3B, in some implementations, the lens 312 may be disposed along an optical path of the second portion of the combined single laser beams 314 (e.g., that is provided by the OC 114) between the OC 114 and the output fiber 130. The lens 312 may be configured to receive the second portion of the combined single laser beams 314 and to direct the second portion of the combined single laser beams 314 to the output fiber 130. For example, the lens 312 may be a coupling lens (e.g., an SCL) that is configured to converge the second portion of the combined single laser beams 314 on the output fiber 130 in a second direction (e.g., converge the second portion of the combined single laser beams 314 in a slow axis direction of the second portion of the combined single laser beams 314, which is approximately parallel to the z axis shown in FIGS. 3A-3B). In some implementations, the lens 312 may be configured to direct the second portion of the combined single laser beams 314 to the output fiber 130 via one or more other components of the optical module 302, such as via one or more optical elements (e.g., one or more lenses, one or more reflectors, and/or one or more other optical elements).

FIGS. 3A-3B are provided as an example. Other examples may differ from what is described with regard to FIGS. 3A-3B.

Figure 4A:
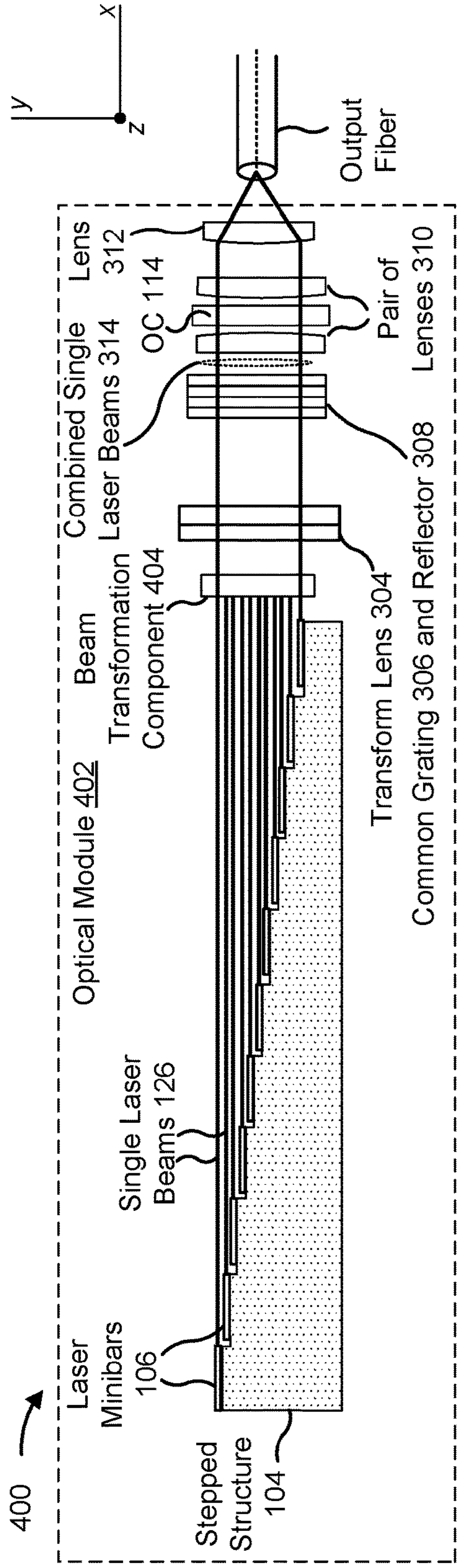
FIGS. 4A-4B are diagrams of an example implementation described herein.
Figure 4B:
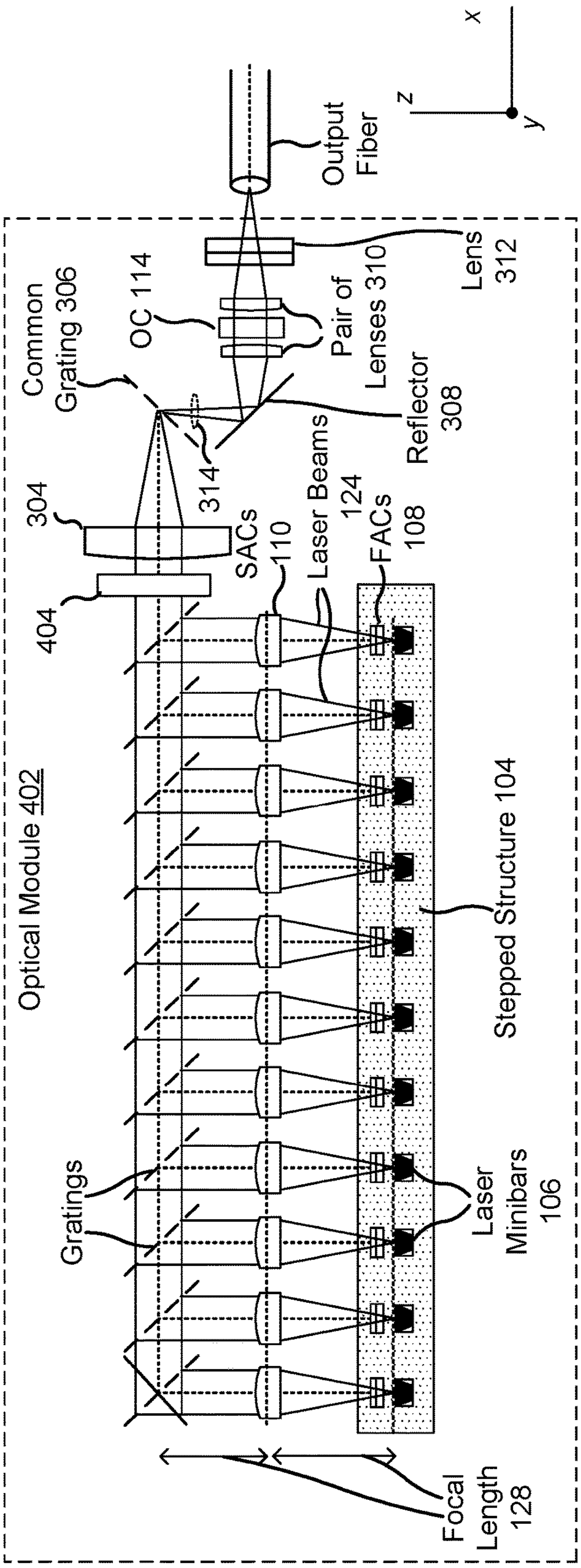

FIGS. 4A-4B are diagrams of an example implementation 400 described herein. As shown in FIGS. 4A-4B, the example implementation 400 comprises an optical module 402. The optical module 302 may be similar to the optical module 102, the optical module 202, and/or the optical module 302, and may therefore include the stepped structure 104, the plurality of laser minibars 106, the plurality of FACs 108, the plurality of SACs 110, the plurality of gratings 112, and/or the OC 114, the transform lens 304, the common grating 306, the reflector 308, the pair of lenses 310, and the lens 312 (e.g., configured in a similar manner as that described herein in relation to FIGS. 1A-1B, 2A-2B, and 3A-3B). As further shown in FIGS. 4A-4B, the optical module 402 may also include one or more other components, such as a beam transformation component 404. FIG. 4A shows a side view of the optical module 402, and FIG. 4B shows a top-down view of the optical module 402.

As shown in FIGS. 4A-4B, the stepped structure 104, the plurality of laser minibars 106, the plurality of FACs 108, the plurality of SACs 110, and the plurality of gratings 112 may be configured in a similar manner as that described herein in relation to FIGS. 1A-1B and/or 3A-3B. Accordingly, the plurality of laser minibars 106 may be configured to emit a plurality of laser beams 124, which may propagate to the plurality of gratings 112 via the plurality of FACs 108 and the plurality of SACs 110. The plurality of gratings 112 may be configured to combine the plurality of laser beams 124 into a plurality of single laser beams 126.

As shown in FIGS. 4A-4B, the plurality of gratings 112 may be configured to direct the plurality of single laser beams 126 to the beam transformation component 404. In this way, the plurality of gratings 112 may be configured to spatially combine the plurality of single laser beams 126 (e.g., in a non-overlapped stack, or a non-overlapped column) when directing the plurality of single laser beams 126 to the beam transformation component 404. For example, the plurality of gratings 112 may direct the plurality of single laser beams 126 to the beam transformation component 404 such that the plurality of single laser beams 126 impinge on the beam transformation component 404 in a stack, or column, where adjacent single laser beams 126 are separated by a gap, such as in a similar manner as that described elsewhere herein. In this way, the plurality of gratings 112 may be configured to provide SBC of the plurality of single laser beams 126 (e.g., in addition to providing WBC of the plurality of laser beams 124 into the plurality of single laser beams 126).

The beam transformation component 404 may include a beam transformation system (BTS), a Dove prism, a pair of mirrors, or another beam transformation component, and may be configured to receive the plurality of single laser beams 126; modify one or more characteristics of the plurality of single laser beams 126, such as a shape or profile of the plurality of single laser beams 126, and/or or rotate the plurality of single laser beams 126 (e.g., by a particular amount of degrees, such as 90 degrees); and to direct the plurality of single laser beams 126 to the transform lens 304. For example, when a fast axis of the plurality of single laser beams 126 is parallel to the y axis shown in FIGS. 4A-4B when received by the beam transformation component 404, the beam transformation component 404 may modify the plurality of single laser beams 126 to cause the fast axis of the plurality of single laser beams 126 to be parallel to the x axis shown in FIGS. 4A-4B. This may enable, for example, other components of the optical module 402 to be mounted on a same surface (e.g., a bottom, interior surface) of the optical module 402, which may not be possible when the beam transformation component 404 is not otherwise present.

The OC 114, the transform lens 304, the common grating 306, the reflector 308, pair of lenses 310, and the lens 312 may be configured in a similar manner as that described herein in relation to FIGS. 1A-1B and/or 3A-3B. Accordingly, the transform lens 304 may be configured to receive and direct the plurality of single laser beams 126 to the common grating 306. The common grating may be configured to receive the plurality of single laser beams 126, to combine (e.g., using WBC) the plurality of single laser beams 126 into combined single laser beams 314, and to direct the combined single laser beams 314 to the OC 114 (e.g., via the reflector 308). The OC 114 may be configured to receive the combined single laser beams 314 (e.g., via a first lens of the pair of lenses 310), reflect a first portion of the combined single laser beams 314 back to the plurality of laser minibars 106 (e.g., to wavelength-lock laser emitters of the plurality of laser minibars 106), and to direct a second portion of the combined single laser beams 314 out of the optical module 302 (e.g., via a second lens of the pair of lenses 310), such as to the output fiber 130. The lens 312 may be disposed along an optical path of the second portion of the combined single laser beams 314 (e.g., that is provided by the OC 114) between the OC 114 and the output fiber 130. The lens 312 may therefore be configured to receive the second portion of the combined single laser beams 314 and to direct the second portion of the combined single laser beams 314 to the output fiber 130.

FIGS. 4A-4B are provided as an example. Other examples may differ from what is described with regard to FIGS. 4A-4B.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations may not be combined.

As used herein, satisfying a threshold may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set. As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiple of the same item.

No element, act, or instruction used herein should be construed as critical or essential unless explicitly described as such. Also, as used herein, the articles "a" and "an" are intended to include one or more items, and may be used interchangeably with "one or more." Further, as used herein, the article "the" is intended to include one or more items referenced in connection with the article "the" and may be used interchangeably with "the one or more." Furthermore, as used herein, the term "set" is intended to include one or more items (e.g., related items, unrelated items, or a combination of related and unrelated items), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of"). Further, spatially relative terms, such as "below," "lower," "bottom" "above," "upper," "top," and the like, may be used herein for ease of description to describe one element or feature's relationship to another element(s) or feature(s) as illustrated in the figures. The spatially relative terms are intended to encompass different orientations of the apparatus, device, and/or element in use or operation in addition to the orientation depicted in the figures. The apparatus may be otherwise oriented (rotated 90 degrees or at other orientations) and the spatially relative descriptors used herein may likewise be interpreted accordingly.

What is claimed is:

1. An optical module, comprising:

a stepped structure that includes a plurality of steps;

a plurality of laser minibars, wherein each laser minibar, of the plurality of laser minibars, comprises a plurality of laser emitters, and wherein each laser emitter, of the plurality of laser emitters, is configured to emit a laser beam that is associated with a particular wavelength that is different than respective wavelengths of laser beams emitted by other laser emitters of the plurality of laser emitters;

a plurality of fast axis collimators (FACs);

a plurality of slow axis collimators (SACs);

a plurality of gratings; and an output coupler (OC), wherein:

each step, of the plurality of steps of the stepped structure, is associated with a particular distance, in a lateral direction, from the OC that is different than respective distances of other steps of the plurality of steps, each laser minibar, of the plurality of laser minibars, is disposed on a particular step, of the plurality of steps, that is different than the other steps of the stepped structure on which other laser minibars are disposed, each FAC, of the plurality of FACs, corresponds to a laser minibar, of the plurality of laser minibars, and is disposed between the laser minibar and a SAC, of the plurality of SACs, that corresponds to the laser minibar, each SAC, of the plurality of SACs, corresponds to a laser minibar, of the plurality of laser minibars, and is disposed between a FAC, of the plurality of FACs, that corresponds to the laser minibar and a grating, of the plurality of gratings, that corresponds to the laser minibar, and each grating, of the plurality of gratings, corresponds to a laser minibar, of the plurality of laser minibars, and is disposed between a SAC, of the plurality of SACs, that corresponds to the laser minibar and the OC, wherein the plurality of gratings are configured to:

receive the plurality of laser beams via the plurality of FACs and the plurality of SACs, provide spatial beam combination (SBC) and wavelength beam combination (WBC) of the plurality of laser beams to form a plurality of single laser beams, and direct the plurality of single laser beams to the OC.

2. The optical module of claim 1, wherein each step, of the plurality of steps of the stepped structure, is associated with a particular height that is different than respective heights of the other steps of the plurality of steps.

3. The optical module of claim 1, wherein each laser emitter is a single mode laser emitter.

4. The optical module of claim 1, wherein a particular SAC, of the plurality of SACs, has a focal length, and the particular SAC corresponds to a particular laser minibar, of the plurality of laser minibars, and to a particular grating, of the plurality of gratings, wherein:

the particular SAC is positioned at a first distance from the particular laser minibar that is equal to the focal length; and the particular SAC is positioned at a second distance from the particular grating that is equal to the focal length.

5. The optical module of claim 1, wherein:

the OC is configured to receive the plurality of single laser beams from the plurality of gratings, and to direct a portion of the plurality of single laser beams out of the optical module.

6. The optical module of claim 1, wherein the plurality of gratings are physically arranged, vertically relative to one another, to enable SBC of the plurality of laser beams.

7. The optical module of claim 5, wherein the OC is configured to reflect another portion of the plurality of single laser beams back to the plurality of laser minibars to cause respective laser emitters of the plurality of laser minibars to be wavelength-locked.

8. The optical module of claim 5, wherein the optical module further comprises at least one of a first lens or a second lens, and wherein the OC is configured to direct the portion of the plurality of single laser beams out of the optical module via at least one of the first lens or the second lens, wherein:

the first lens is a fast axis coupling lens (FCL), and the second lens is a slow axis coupling lens (SCL).

9. The optical module of claim 5, wherein the optical module further comprises a transform lens and a common grating, wherein:

the OC is configured to receive the plurality of single laser beams from the plurality of gratings via the transform lens and the common grating, the transform lens is a Fourier transform lens that is configured to converge the plurality of single laser beams on the common grating, and the common grating is configured to direct the plurality of single laser beams as combined single laser beams to the OC.

10. An optical module, comprising:

a stepped structure that includes a plurality of steps;

a plurality of laser minibars;

a plurality of fast axis collimators (FACs);

a plurality of slow axis collimators (SACs);

a plurality of gratings;

an output coupler (OC), wherein:

at least one laser minibar, of the plurality of laser minibars, is disposed on each step of the plurality of steps of the stepped structure, the plurality of laser minibars are configured to emit a plurality of laser beams;

the plurality of gratings are configured to receive the plurality of laser beams via the plurality of FACs and the plurality of SACs, to combine the plurality of laser beams into a plurality of single laser beams, and to direct the plurality of single laser beams to the OC; and the OC is configured to receive the plurality of single laser beams from the plurality of gratings, and to direct a portion of the plurality of single laser beams out of the optical module;

a common grating;

a transform lens, wherein:

the transform lens is configured to converge the plurality of single laser beams on the common grating, and the common grating is configured to direct the plurality of single laser beams as combined single laser beams to the OC; and a pair of lenses, wherein:

a first lens, of the pair of lenses, is configured to collimate the combined single laser beams prior to the combined single laser beams propagating to the OC; and a second lens, of the pair of lenses, is configured to collimate the combined single laser beams after a portion of the combined single laser beams propagate from the OC.

11. The optical module of claim 10, wherein the plurality of laser minibars are configured as multiple columns.

12. The optical module of claim 10, wherein each laser minibar, of the plurality of laser minibars, comprises a plurality of laser emitters, wherein each laser emitter, of the plurality of laser emitters, is wavelength-locked at a particular wavelength that is different than respective wavelengths at which other laser emitters, of the plurality of laser emitters, are wavelength-locked.

13. The optical module of claim 10, wherein a particular SAC, of the plurality of SACs, has a focal length, and the particular SAC corresponds to a particular laser minibar, of the plurality of laser minibars, and to a particular grating, of the plurality of gratings, wherein:

the particular SAC is positioned at a first distance from the particular laser minibar that is equal to the focal length; and the particular SAC is positioned at a second distance from the particular grating that is equal to the focal length.

14. The optical module of claim 10, wherein the plurality of gratings are physically arranged, vertically relative to one another, to enable spatial beam combination (SBC) of the plurality of laser beams into the plurality of single laser beams.

15. The optical module of claim 10, wherein the optical module further comprises a transform lens and a common grating, wherein:

the transform lens is configured to converge the plurality of single laser beams on the common grating, and the common grating is configured to direct the plurality of single laser beams as combined single laser beams to the OC.

16. The optical module of claim 10, wherein the plurality of gratings are further configured to:

provide wavelength beam combination (WBC) of the plurality of laser beams to form the plurality of single laser beams.

17. An optical module, comprising:

a stepped structure that includes a plurality of steps;

a plurality of laser minibars;

a plurality of slow axis collimators (SACs); and a plurality of gratings, wherein:

a particular laser minibar, of the plurality of laser minibars, is disposed on a particular step, of the plurality of steps, that is different than other steps of the stepped structure on which other laser minibars are disposed, a particular SAC, of the plurality of SACs, corresponds to the particular laser minibar, a particular grating, of the plurality of gratings, corresponds to the particular laser minibar, the particular SAC is positioned between the particular laser minibar and the particular grating, the particular SAC is a first distance from the particular laser minibar that is equal to a focal length of the particular SAC; and the particular SAC is positioned at a second distance from the particular grating that is equal to the focal length.

18. The optical module of claim 17, wherein;

the particular laser minibar is configured to emit a plurality of laser beams;

the particular SAC is configured to receive, from the particular laser minibar, the plurality of laser beams, to collimate the plurality of laser beams, and to direct the plurality of laser beams to the particular grating; and the particular grating is configured to receive, from the particular SAC, the plurality of laser beams, to combine the plurality of laser beams into a single laser beam, and to direct the single laser beam to an output coupler (OC) of the optical module.

19. The optical module of claim 18, wherein the optical module further comprises a transform lens and a common grating, wherein:

the particular grating is configured to direct the single laser beam to the OC via the transform lens and the common grating.

20. The optical module of claim 17, wherein the plurality of gratings are configured to provide spatial beam combination (SBC) and wavelength beam combination (WBC).

* * * * *